United States Patent [19]

Suzuki

[11] Patent Number: 4,852,164

[45] Date of Patent: Jul. 25, 1989

[54] PULSE GENERATING APPARATUS

[75] Inventor: Kazuo Suzuki, Gifu, Japan

[73] Assignee: Matsushita Electric Industrial Co., Ltd., Osaka, Japan

[21] Appl. No.: 20,739

[22] Filed: Mar. 2, 1987

[30] Foreign Application Priority Data

Mar. 5, 1986 [JP] Japan ............................ 61-46358

[51] Int. Cl.$^4$ .................. H04N 7/167; H03K 5/153
[52] U.S. Cl. ................................ 380/15; 307/356; 307/358
[58] Field of Search ............... 307/356, 358; 380/15

[56]        References Cited
        U.S. PATENT DOCUMENTS

| 3,461,390 | 8/1969 | Mack | 307/358 |
| 4,071,781 | 1/1978 | Kayalioglu | 307/358 |
| 4,241,455 | 12/1980 | Eibner | 307/358 |
| 4,375,037 | 2/1983 | Ikushima | 307/358 |
| 4,567,517 | 1/1986 | Mobley | 380/15 |
| 4,635,142 | 1/1987 | Haugland | 307/358 |

Primary Examiner—Stephen C. Buczinski
Attorney, Agent, or Firm—Stevens, Davis, Miller & Mosher

[57] ABSTRACT

Disclosed is a pulse generating apparatus used in a CATV receiving adapter for descrambling the sync signal in the video signal. The pulse generating apparatus comprises a peak detector for sampling the peak in the detected video signal, a half level detector for evaluating the half level of the detected peak voltage, and a pulse generator which compares the detected video signal with the half level voltage and produces a pulse rising at a time point of coincidence or the two voltage signals.

12 Claims, 8 Drawing Sheets

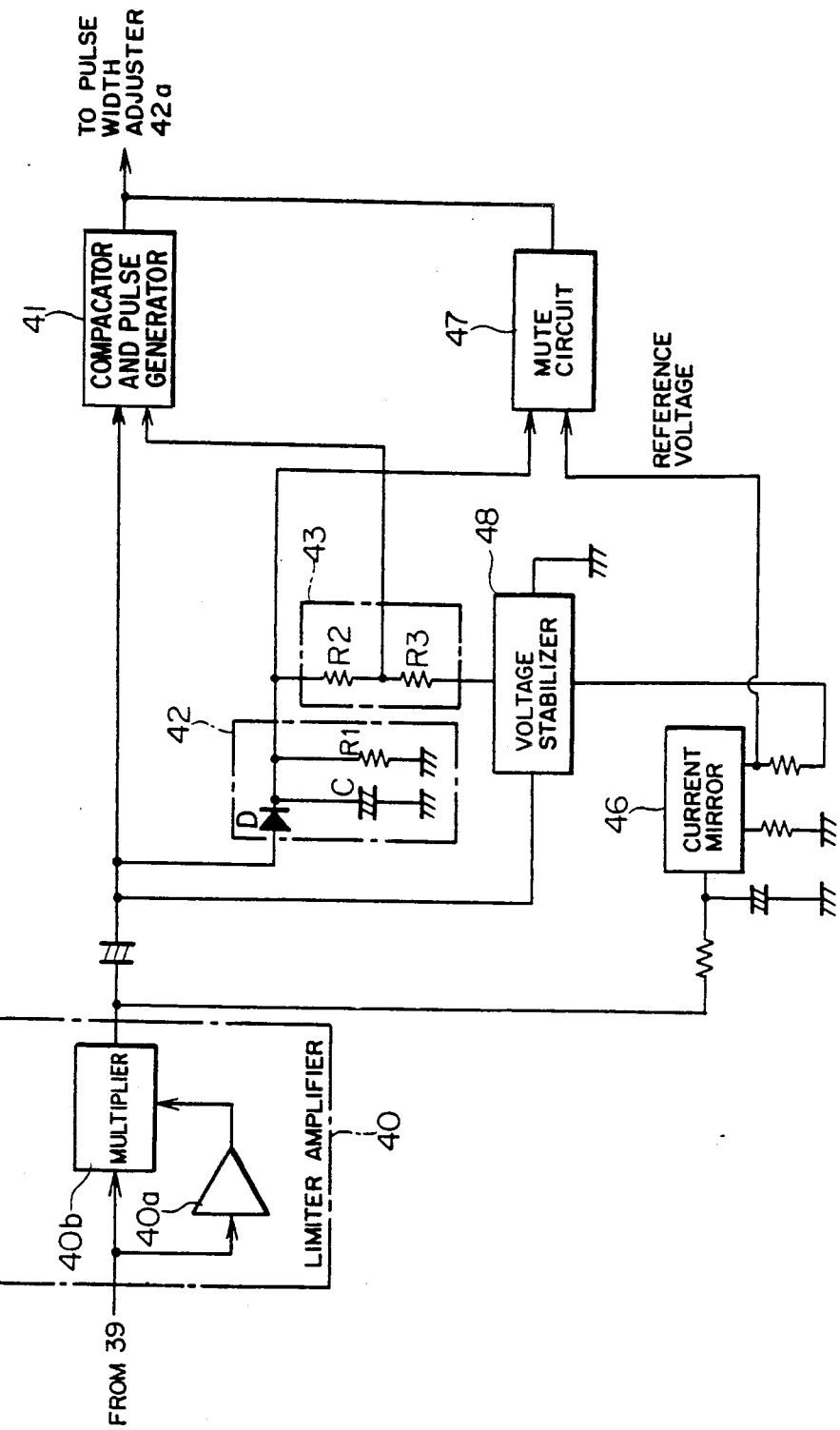

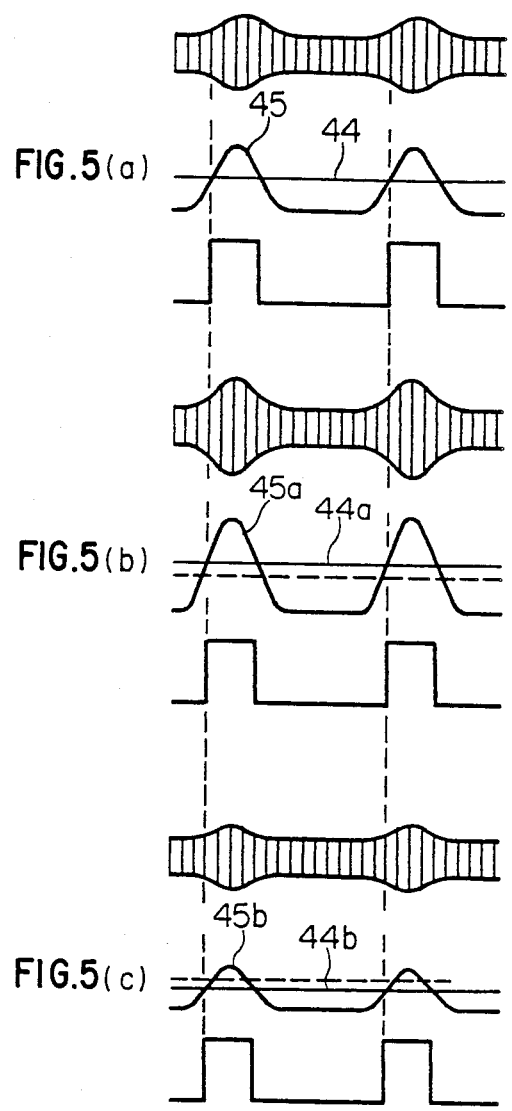

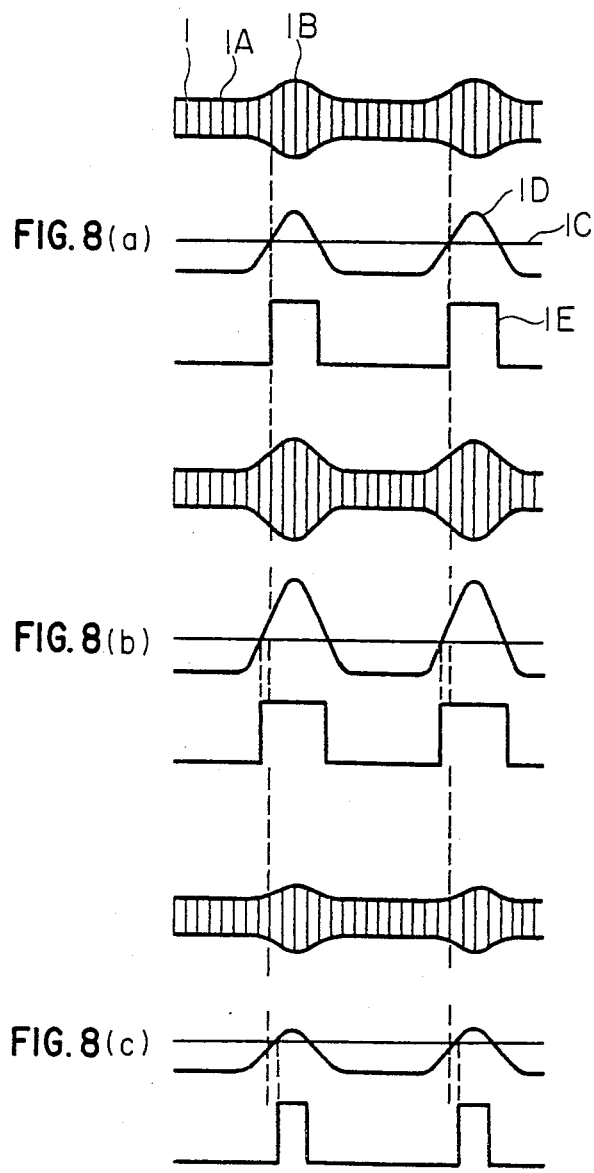

PULSE GENERATING APPARATUS

BACKGROUND OF THE INVENTION

1. Field of the Invention

This invention relates to a pulse generating apparatus, and more particularly, to a pulse generating apparatus for generating pulses used to descramble a scrambled video signal in a cable television system for example.

2. Description of the Related Art

Cable television (CATV) is a toll broadcasting service, and only subscribers can view its programs. The CATV video signal has its sync signal portion scrambled so as to preclude non-subscribers from viewing the programs, and subscribers' CATV receiver sets are equipped with a device for descrambling the scrambled sync signal.

A conventional descrambling circuit will be described with reference to FIG. 7. The block diagram in FIG. 7 shows only the pulse generating apparatus which produces pulses for descrambling the scrambled sync signal, and the input signal 1 is a AM audio signal in the television signal. In this conventional system, the audio signal is amplitude modulated by a signal used for descrambling the video signal, and the descrambling signal is detected from the amplitude modulated (AM) audio signal. The descrambling signal is added to the video signal so that the scrambled sync signal is descrambled, and then the video signal is made normally visible by an ordinary TV set. In FIG. 7, symbol 1 denotes an AM signal input, 2 is an AM detector, 3 is an AM detector output, 4 is an integrator, 5 is a reference voltage, 6 is a threshold voltage, 7 is a comparator and rectangular pulse generator which compares the AM detector output with the threshold voltage, and 8 is a rectangular pulse output which is delivered to the video signal processing portion of the CATV receiver to descramble the scrambled video signal.

The AM signal input 1 is detected by the AM detector 2, and the resulting AM detector output 3 is fed to one input of the pulse generator 7. The AM detector output 3 is separately integrated by the integrator 4, which output is added by the reference voltage 5 to form the threshold voltage 6, and it is fed to another input of the pulse generator 7. The pulse generator 7 produces a rectangular pulse when the voltage of the AM detector output 3 is higher than the threshold voltage 6. The integrator 4 provides an average voltage of the AM detector output 3 to shift the threshold voltage 6, thereby compensating the fluctuation of the rise timing of rectangular pulses caused by a change in the level of the AM signal input 1 due to transmission conditions or the like.

In the foregoing conventional circuit arrangement, the fluctuation of the AM signal peak level is followed by the d.c. level of the integrator output. Therefore, the displacement of the pulse rise timing of the rectangular pulse can be corrected. However, in case the AM modulation depth differs among transmitters due to their accuracy or the like, only the peak level of the AM detector output varies differently on each transmission channel, with the d.c. output voltage level of the integrator 4 being unchanged, and therefore the displacement of the pulse rise timing cannot be corrected. A significant timing displacement causes the video signal portion to receive the rectangular pulse output at an erroneous timing, and such inaccurate descrambling operation cannot reproduce well-synchronized pictures. The matter will further be described in connection with FIG. 8.

FIG. 8(a) is the case of the standard AM modulation depth. For the standard AM modulation depth to have a peak-to-bottom voltage ratio (between the portions 1A and 1B) of 6 dB for example, the reference voltage is determined so that rectangular pulses are produced at a 50% AM detector output. In the figure, symbol 1C denotes the threshold voltage, 1D is the AM detector output, and 1E is the rectangular pulse.

FIG. 8(b) is the case of a greater modulation depth than standard, showing that the threshold voltage does not follow the varying AM modulation depth, and the rectangular pulses are generated at the AM detector output below 50%, resulting in a leading pulse rise timing as compared with the case of FIG. 8(a).

FIG. 8(c) is the case of a smaller modulation depth than standard, showing the generation of the rectangular pulses at the AM detector output above 50%, resulting in a lagging pulse rise timing as compared with the case of FIG. 8(a).

The cases of FIGS. 8(b) and 8(c) fail to achieve the accurate descrambling and do not reproduce correct, synchronized pictures.

SUMMARY OF THE INVENTION

An object of this invention is to overcome the foregoing prior art deficiencies and provide a pulse generating apparatus which generates pulses always at a constant timing of rising edge, even if the modulated signal input has a fluctuating modulation depth, so that the circuit receiving the pulses operates stably.

The inventive pulse generating apparatus comprises a peak detector which detects the peak voltage in a periodical input signal, a half level detector which detects the half level of the peak voltage, and a pulse generator which generates a rising pulse in response to the coincidence of the input signal with the half level. The pulse generator produces pulses always at a 50% input signal level as a threshold level, and therefore always at a constant timing even if the modulated input signal level or its modulation depth fluctuates, whereby a circuit receiving the pulses can operate stably. The invariable 50% input threshold level also minimizes the influence of noises created by low-voltage and high-voltage circuit portions, and this is effective for the stable operation of the apparatus in constant timing.

BRIEF DESCRIPTION OF THE DRAWINGS

FIG. 4 is a schematic block diagram showing the pulse generating circuit in the set-top terminal unit;

FIG. 5 is a set of waveform diagrams used to explain the operation of the pulse generating circuit;

FIG. 8 is a set of waveform diagrams used to explain the operation of the conventional pulse generating apparatus.

DESCRIPTION OF THE PREFERRED EMBODIMENT

An embodiment of this invention will now be described. It is assumed that the CATV video signal has its sync signal scrambled, and a signal for descrambling the sync signal is amplitude modulated to the audio signal.

Figure 2:
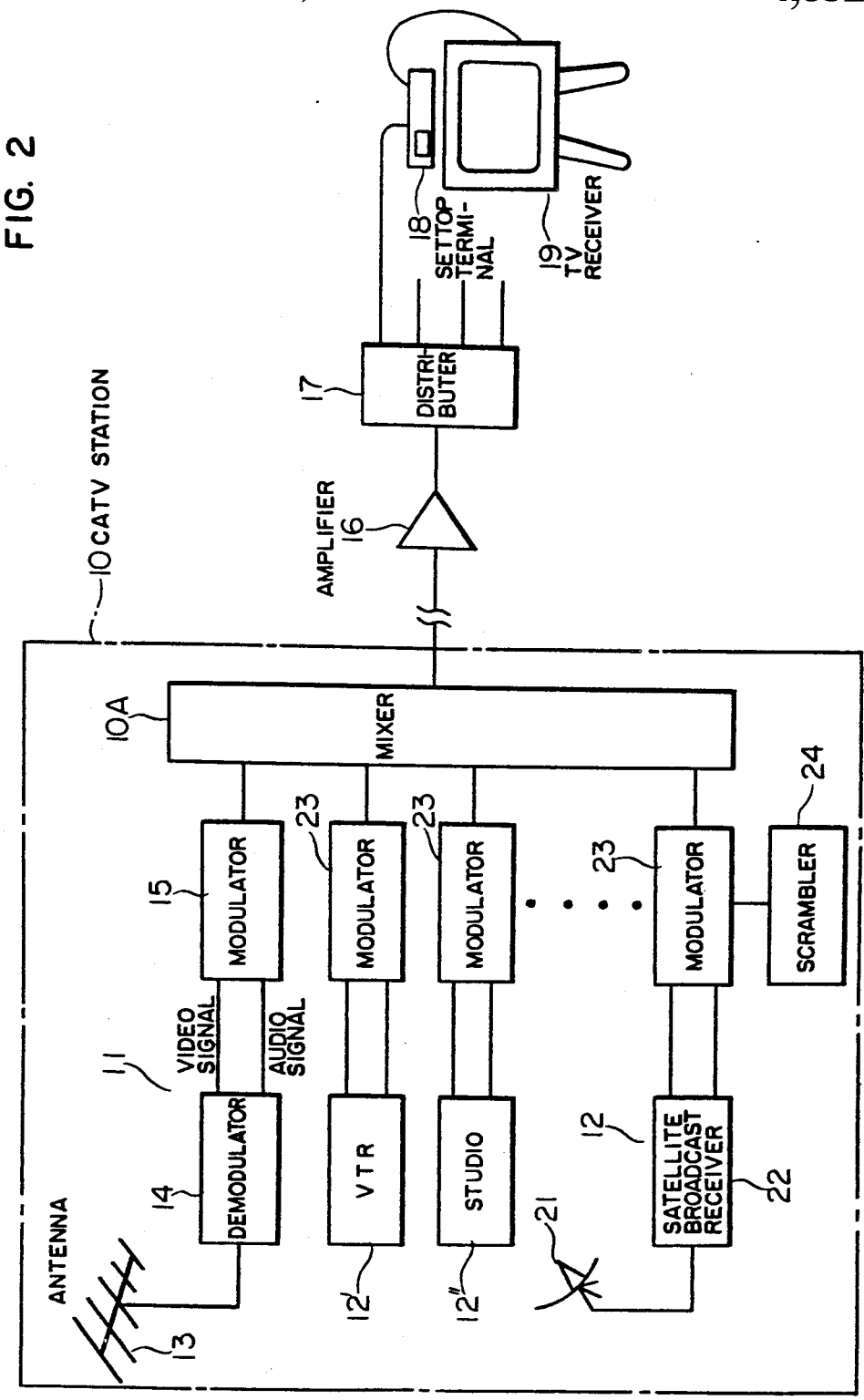
FIG. 2 is a schematic block diagram showing the application of this invention to a cable television receiver set.

In FIG. 2, a CATV station 10 has facilities for channels from channel-1 (11) to channel-82 (12). Among the channels, channel-1 is used exclusively for converting an ordinary TV radio signal into a CATV signal. In this case, the radio signal is received by an antenna 13 and demodulated by a demodulator 14. The video signal and audio signal are modulated into a CATV signal by a modulator 15, mixed with signals on other channels by a mixer 10A, amplified by an amplifier 16, and distributed through a distributer 17 to subscribers. The CATV signal is fed through a subscriber's set-top terminal unit 18 to a television receiver set 19, on which the picture and sound are reproduced. The channel-1 (11) alloted to the ordinary TV programs is not tolled, and therefore the sync signal in the video signal is not scrambled. The remaining channels from channel-2 to channel-82 (12', 12", ..., 12) are original broadcastings by the CATV station 10, and they are offered only to the subscribers. In this case, a radio signal from a program producing station is received through an antenna 21 and satellite broadcasting receiver 22, and signals are also supplied from a video tape recorder 12' and a studio 12". In each modulator 23 for these signals, the sync signal in the video signal is scrambled using a signal produced by a scrambler 24, and the audio signal is modulated in AM mode by the modulator 23 using a signal for reproducing the scrambled sync signal. The modulated signal is mixed with signals of other channels by the mixer 10A, amplified by the amplifier 16, and distributed through the distributer 17 to subscribers. The CATV signal is fed through the subscriber's set-top terminal unit 18 to the television receiver set 19, on which the picture and sound are reproduced.

Figure 3:
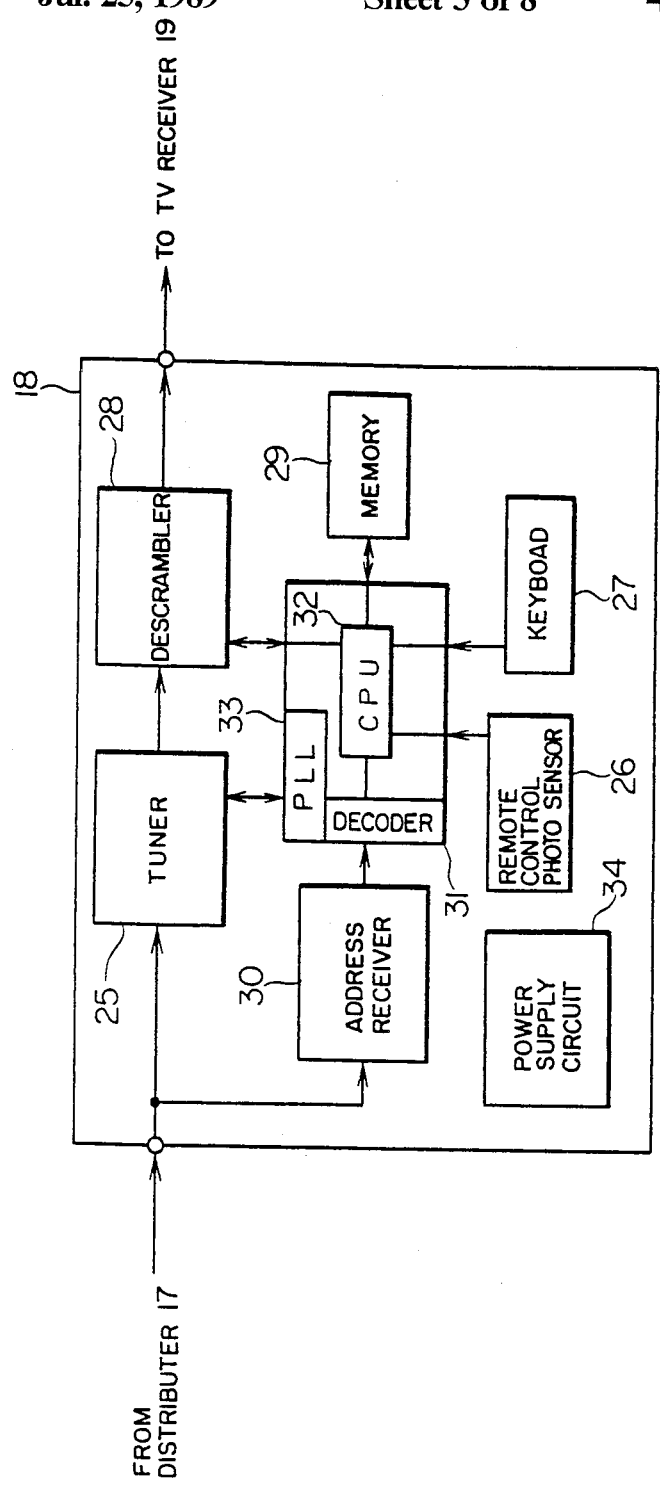
FIG. 3 is a schematic block diagram of the set-top terminal unit shown in FIG. 2.

Next, the internal arrangement of the set-top terminal unit 18 will be described with reference to FIG. 3. The signal from the distributer 17 is selected in a tuner 25 to extract only a channel specified through a remote control photosensor 26 or keyboard 27. The video signal with the scrambled sync signal is reproduced correctly by a descrambler 28 and fed to the television receiver set 19, on which the picture and sound are reproduced. In this case, implementation of descrambling the sync signal is dependent on as to whether the pertinent channel has been set in a memory 29 at the subscription contract. When the channel is allowed by the contract, the channel allowance information is set to the memory 29 by way of an address receiver 30, decoder 31 and CPU 32, and based on the information the tuner 25 is operated through a PLL 33 to select the station and, at the same time, the CPU 32 issues a command for reproducing the video signal by descrambling the sync signal. Reference number 34 in FIG. 3 denotes a power supply circuit.

The following describes scrambling and descrambling of the sync signal. In FIG. 6B, a sync signal K protruding downward as shown in (a) is turned upward by scrambling as shown in (b). When the signal is descrambled, the sync signal K protruding downward is restored as shown in (c), allowing correct reproduction of the sync signal, and consequently well synchronized pictures are reproduced. Symbol L in the waveforms (c) denotes the output of the AM detector 40, and M denotes the output of the comparator and pulse generator 41.

Figure 1:
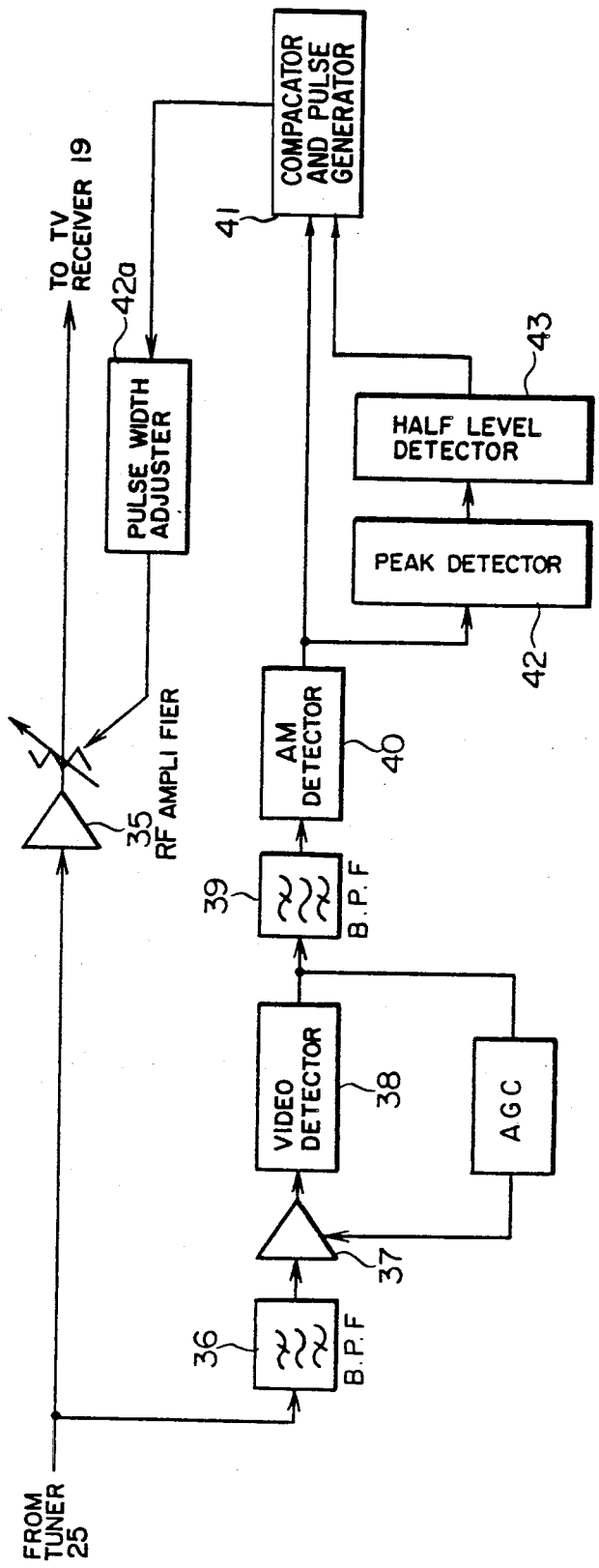
FIG. 1 is a schematic block diagram showing the descrambling circuit embodying the present invention.

Next, the descrambler 28 will be described with reference to FIG. 1. The scrambled television signal tuned by the tuner 25 is split into two parts at the entry of the descrambler 28. One part is delivered to an RF amplifier 35 which raises the signal amplitude in response to pulses supplied from the outside, while another part is fed through a band-pass filter 36 for band confinement to an amplifier 37, by which the signal is amplified, and the video signal is detected by a video detector 38. A band-pass filter 39 extracts only the 4.5 MHz beat from the output signal of the video detector 38, and it is subjected to AM detection by an AM detector 40. The AM detector output is split into two parts, one being fed to a comparator and pulse generator 41, while the other being fed to a peak detector 42, by which the peak voltage of the output waveform from the AM detector 40 is detected. A half level detector 43 evaluates the half level of the peak voltage, and it is supplied to the comparator and pulse generator 41. The pulse generator 41 compares the AM detect output with the half level detector output, and produces a pulse when the AM detector output voltage is higher. The output pulse has its width adjusted by a pulse width adjuster 42a to the duration of a compressed sync signal, and it is delivered to the RF amplifier 35. The RF amplifier 35 operates to raise the signal amplitude only during the period of pulse application, and consequently the scrambled sync signal can be descrambled.

FIG. 5(a) is the case of the standard AM modulation depth. The threshold voltage 44 is half the output of the peak detector 42 as determined by the half level detector 43, and therefore rectangular pulses are produced at a 50% level of the output 45 of the AM detector 40.

FIG. 5(b) is the case of a greater modulation depth than standard. The threshold voltage 44a which represents the half level of the peak voltage 45a rises with the rise of the peak voltage 45a, producing rectangular pulses at a 50% level of the AM detector output, and the rise timing of rectangular pulses is identical to the case of the standard modulation depth shown in FIG. 5(a).

FIG. 5(c) is the case of a smaller modulation depth than standard. The threshold voltage 44b falls with the fall in the peak voltage 45b, and the rise timing of rectangular pulses is identical to the case of the standard modulation depth shown in FIG. 5(a). Accordingly, the rise timing of rectangular pulses is invariable irrespective of the modulation depth.

Figure 6A:
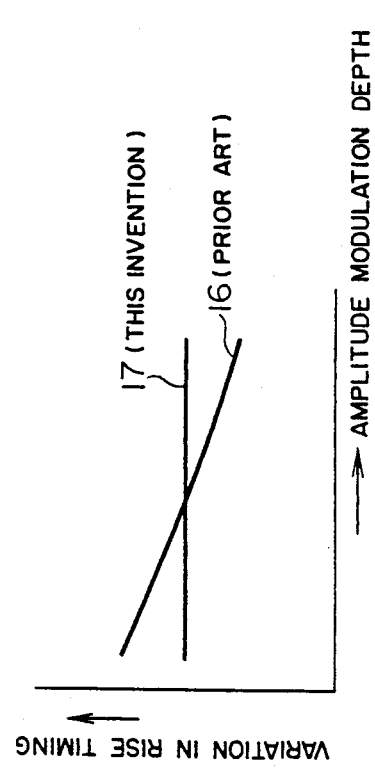
FIG. 6A is a graph comparing the characteristics of the inventive pulse generator with the conventional one.
Figure 6B:
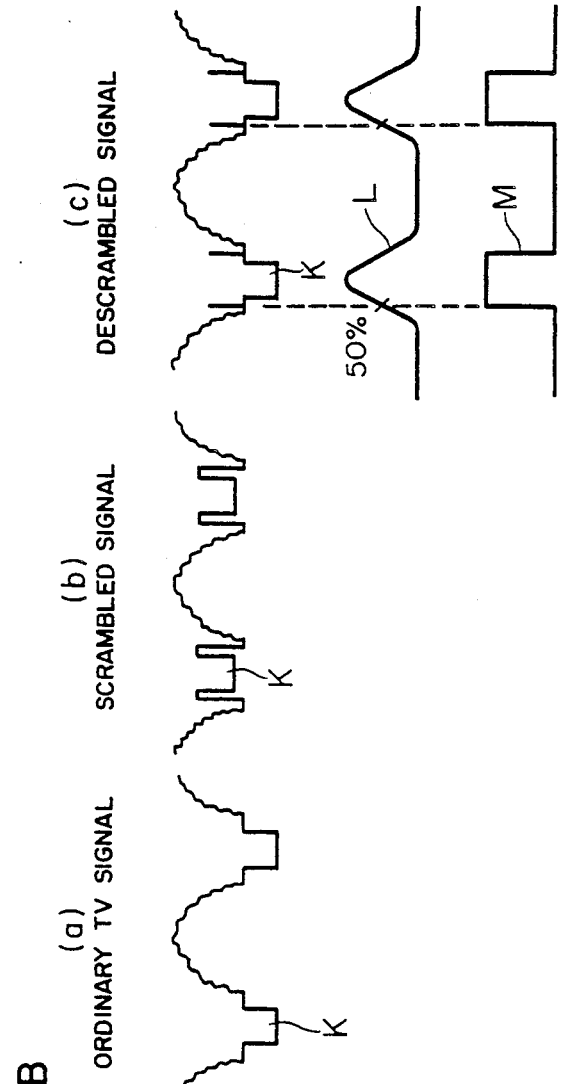
FIG. 6B is a set of waveform diagrams showing the scrambled and descrambled video signals.
Figure 7:
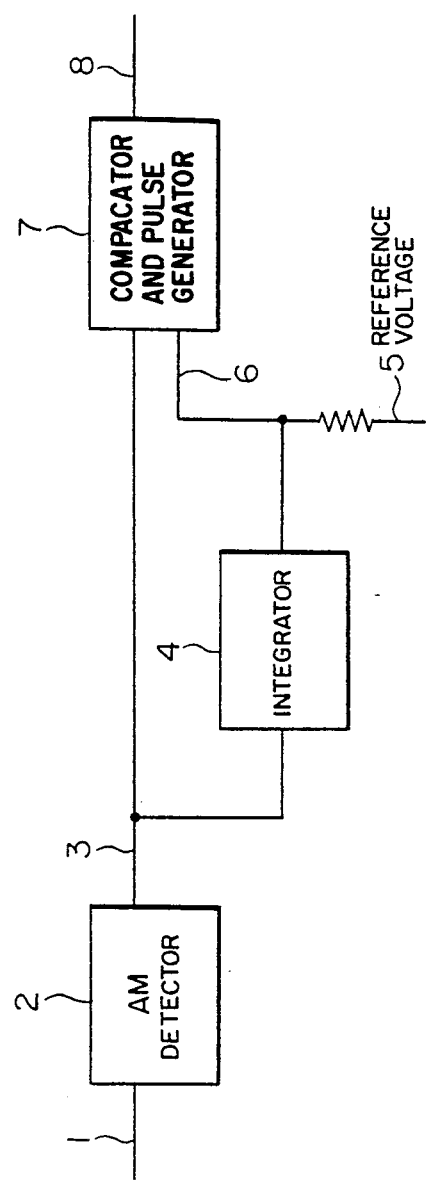
FIG. 7 is a block diagram of the conventional pulse generating apparatus.

FIG. 6A shows in graph the variation in the rise timing according to the conventional pulse generating apparatus as indicated by 16 and that of the inventive pulse generating apparatus as indicated by 17. The graph show that the inventive pulse generating apparatus retains a constant rise timing of rectangular pulses against the variation in the AM modulation depth.

FIG. 4 shows the arrangement of the peak hold circuit (peak detector) 42 and its periphery. The circuit 42 consists of a diode D and a parallel connection of a capacitor C and resistor R1 connected in parallel to the diode D. The half level detector 43 consists of resistors R2 and R3 connected in parallel to the parallel connection of the capacitor C and resistor R1, with the node of R2 and R3 being connected to the comparator and pulse generator 41. The AM detector 40 consists of a limiter amplifier 40a and a multiplier 40b. Reference number 46 denotes a current mirror circuit which produces a reference voltage for a mute circuit 47 which cuts off the pulse output when a non-scrambled channel, e.g., channel-1 in this embodiment, is tuned. A constant voltage circuit (voltage stabilizer) 48 is used to stabilize the voltage at the lower end of the resistor R3, and the circuit may be replaced with the ground wiring.

I claim:

1. A descrambling apparatus for descrambling a scrambled signal having a signal component amplitude modulated with descrambling information, said descrambling apparatus comprising:
   an amplitude modulation detector for detecting the amplitude modulation of said signal component;
   a peak detector for peak detecting an output signal of said amplitude modulation detector;
   a half level detector for detecting a half level of an output signal of said peak detector;
   a comparator and pulse generator receiving said output signal of said amplitude modulator and an output signal of said half level detector and producing a pulse output signal rising at a time point of coincidence of said output signal of said amplitude modulation detector and said output signal of said half level detector;
   a mute circuit for muting the pulse output signal of said comparator and pulse generator, one input of said mute circuit being connected to the output of said peak detector and another input of said mute circuit being connected to a reference voltage, said mute circuit cutting off the pulse output of said comparator and pulse generator when a non-scrambled signal is indicated by the output of said peak detector; and
   means responsive to the pulse output signal of said pulse generator for descrambling an applied scrambled signal.

2. A descrambling apparatus according to claim 1, further comprising a pulse width adjuster for adjusting the width of the pulse output signal of said pulse generator.

3. A descrambling apparatus according to claim 1, wherein said descrambling means adjusts the level of a scrambled sync signal in a video signal in accordance with the pulse output signal of said pulse generator.

4. A pulse generating apparatus according to claim 3, further comprising a pulse width adjuster for adjusting the width of the pulse output signal of said pulse generator.

5. A descrambling apparatus for descrambling a scrambled signal having a signal component amplitude modulated with descrambling information, said descrambling apparatus comprising:
   an amplitude modulation detector for detecting the amplitude modulation of said signal component;
   a peak detector for peak detecting an output signal of said amplitude modulation detector, said peak detector being formed by the parallel connection of a capacitor and a resistor;
   a half level detector for detecting a half level of an output signal of said peak detector;
   a comparator and pulse generator receiving said output signal of said amplitude modulator and an output signal of said half level detector and producing a pulse output signal rising at a time point of coincidence of said output signal of said amplitude modulation detector and an output signal of said half level detector;
   a mute circuit for muting the pulse output signal of said comparator and pulse generator, one input of said mute circuit being connected to the output of said peak detector and another input of said mute circuit being connected to a reference voltage, said mute circuit cutting off the pulse output of said comparator and pulse generator when a non-scrambled signal is indicated by the output of said peak detector; and
   means responsive to the pulse output signal of said pulse generator for descrambling an applied scrambled signal.

6. A descrambling apparatus according to claim 5, further comprising a pulse width adjuster for adjusting the width of the pulse output signal of said pulse generator.

7. A descrambling apparatus according to claim 5, wherein said descrambling means adjusts the level of a scrambled sync signal in a video signal in accordance with the pulse output signal of said pulse generator.

8. A pulse generating apparatus according to claim 7, further comprising a pulse width adjuster for adjusting the width of the pulse output signal of said pulse generator.

9. A descrambling apparatus for descrambling a scrambled signal having a signal component amplitude modulated with descrambling information, said descrambling apparatus comprising:
   an amplitude modulation detector for detecting the amplitude modulation of said signal component;
   a peak detector for peak detecting an output signal of said amplitude modulation detector, said peak detector being formed by the parallel connection of a capacitor and a resistor;
   a half level detector for detecting a half level of an output signal of said peak detector, said half level detector being formed by resistors connected in parallel to said parallel connection of a resistor and capacitor forming said peak detector;
   a comparator and pulse generator receiving said output signal of said amplitude modulator and an output signal of said half level detector and producing a pulse output signal rising at a time point of coincidence of said output signal of said amplitude modulation detector and said output signal of said half level detector, said resistors of said half level detector having a node connected to said pulse generator;
   a mute circuit for muting the pulse output signal of said comparator and pulse generator, one input of said mute circuit being connected to the output of said peak detector and another input of said mute circuit being connected to a reference voltage, said mute circuit cutting off the pulse output of said comparator and pulse generator when a non-scrambled signal is indicated by the output of said peak detector; and
   means responsive to the pulse output signal of said pulse generator for descrambling an applied scrambled signal.

10. A descrambling apparatus according to claim 9, further comprising a pulse width adjuster for adjusting the width of the pulse output signal of said pulse generator.

11. A pulse generating apparatus according to claim 9, wherein said descrambling means adjusts the level of a scrambled sync signal in a video signal in accordance with the pulse output signal of said pulse generator.

12. A pulse generating apparatus according to claim 11, further comprising a pulse width adjuster for adjusting the width of the pulse output signal of said pulse generator.

* * * * *